United States Patent [19]

Stromswold et al.

[11] 4,305,159
[45] Dec. 8, 1981

[54] COMPRESSIVE RECEIVER

[75] Inventors: Chester E. Stromswold, Nashua; John T. Apostolos, Manchester, both of N.H.; Robert P. Boland, Malden; Walter J. Albersheim, Wayban, both of Mass.

[73] Assignee: Sanders Associates, Inc., Nashua, N.H.

[21] Appl. No.: 871,297

[22] Filed: Jan. 23, 1978

[51] Int. Cl.³ ................. H04B 1/16; H04B 17/00
[52] U.S. Cl. .................... 455/226; 455/148; 333/145; 324/77 B; 364/485
[58] Field of Search ............ 325/332, 333, 335, 336, 325/337, 363, 311, 435, 484, 487, 334, 323, 226; 324/77 B, 77 C, 77 CS; 364/485; 331/178; 343/172 PC, 5 SA; 333/138, 144, 145, 141; 455/145, 146, 147, 148

[56] References Cited
U.S. PATENT DOCUMENTS

| 2,954,465 | 9/1960 | White | 325/137 |
| 3,381,243 | 4/1968 | Darlington | 325/137 |
| 3,382,460 | 5/1968 | Blitz et al. | 325/335 |
| 3,806,840 | 4/1974 | Whitney et al. | 333/145 |

OTHER PUBLICATIONS

Chirp Signal Processing Using Acoustic Surface Wave Filters, by Judd, 1975 Ultrasonics Symposium Proceedings, IEEE Cat. #75, CHO 994-4SU, pp. 350-354.
A Novel Saw Variable Frequency Filter, by Mainex, 1975 Ultrasonics Symposium Proceedings, IEEE Cat. #75, CHO 994-4SU, pp. 355-358.
Compressive Intercept Receiver Uses Saw Devices, by Harrington et al., Saw Series No. 5, Hughes Aircraft Company, pp. 57-61.

Primary Examiner—Jin F. Ng
Assistant Examiner—Tommy P. Chin
Attorney, Agent, or Firm—Louis Etlinger; Ronald Reichman

[57] ABSTRACT

The envelope detector of a compressive receiver is replaced with either a Fourier Transform device or a demodulator such that the output of the dispersive delay line utilized in the receiver is processed to yield the spectrum of the incoming signals and/or the modulation impressed on the incoming signals, thus to permit rapid identification of a signal and its source. In order to permit spectral analysis and/or demodulation of many signals over wide bandwidths, an especially wide bandwidth dispersive delay line is utilized along with a sweep-to-sweep phase coherent variable frequency oscillator.

13 Claims, 6 Drawing Figures

COMPRESSIVE RECEIVER

FIELD OF INVENTION

This invention relates to compressive receivers and more particularly, to the finding that the output signal from the dispersive delay line used in the receiver is, in fact, Fourier transformable or completely demodulatable.

BACKGROUND OF THE INVENTION

One of the most important problems in electronic surveillance involves the recognition of a signal in a multisignal environment. In the past, it has been common to use so-called compressive receivers for rapidly sweeping a given band of frequencies to determine the presence or existence of a signal and its frequency. However, the mere identification of the presence of a signal and its frequency is almost always insufficient to obtain the identity of the signal and thus its source. It is, therefore, important to identify some other signal parameters as a key to the source of the signal. In this invention, the parameters selected are frequency spectrum and modulation.

Historically, compressive receivers have been used as power spectrum analyzers in which an envelope detector is connected to the output of the dispersive delay line utilized with the compressive receiver. The mere detection of the envelope results only in information that a signal of a particular center frequency is present and it is difficult to obtain any further information about the particular signals. It should be noted that envelope detection also destroys most spectral information.

It is a characteristic of compressive receivers that the output of the dispersive delay line utilized with the compressive receiver produces a compressed pulse carrying what is called "residual FM" (frequency modulation). This means that the oscillations in the envelope actually change frequency towards the ends of the envelope and it was thought that because of the "residual FM", both complete demodulation and spectral analysis would be impossible. Thus, historically, the output of the compressive receiver was fed to an envelope detector so that at least the center frequency of the signal could be obtained.

It has been found that in spite of the "residual FM", the output of a compressive receiver can, in fact, be successfully demodulated and/or a spectral analysis successfully performed. In an involved mathematical computation, it was learned that with a sweep-to-sweep phase coherent variable frequency oscillator, effect of the "residual FM" is cancelled, thereby leaving a signal which is, in fact, Fourier transformable and which, in fact, can be completely demodulated without foldover. This has been proven in subsequent testing.

With this finding and a sampling rate above the valid sampling rate for signals of interest, signals previously switched to conventional receivers for demodulation and/or spectral analysis can be demodulated or Fourier transformed in the compressive receiver itself by dispensing with the envelope detector and adding demodulating or Fourier transform circuits. Thus, the modulation on a signal and its spectral signature or "fingerprint" can be obtained in real time and without further apparatus. This permits extremely rapid identification of the source of a signal wih one receiver.

Thus, it is a finding of this invention that by replacing the standard envelope detector with an FFT (Fast Fourier Transform) or other equivalent devices and that by utilizing a sweep-to-sweep phase coherent variable frequency oscillator, a Fourier transformable signal is, in fact, present at the output of the dispersive delay line, be it a conventional dispersive delay line or the wide bandwidth embodiment described hereinafter. Moreover, it is a finding of this invention that complete demodulation is, in fact, possible using standard demodulators in place of the envelope detector, along with the sweep-to-sweep phase coherent variable frequency oscillator.

In compressive receiver systems with appropriate band pass or inphase and quadrature (I and Q) processing, the theoretical required sampling rate is one-half the commonly accepted Nyquist rate for base band sampling. Thus, the minimum valid sampling rate is equal to the bandwidth of the signal of interest. As a practical matter in compressive receivers, a factor of $1.4 \times$ the bandwidth assures unaliased sampling.

When the present day compressive receiver is utilized in a sweep mode in which the incoming signal is heterodyned with a fast sweeping local oscillator signal, rapid sweeping of the compressive receiver ordinarily results in a sampling rate too slow, e.g. below the "valid sampling" rate, for complete demodulation and/or spectral analysis for certain signals of interest. This slow rate is primarily due to the limited bandwidth of present day dispersive delay lines used with the compressive receiver.

By way of background, in general, the compressive receiver is one which employs a linear variable frequency oscillator. This oscillator is swept such that its signal, when mixed with an incoming signal (should one be present), produces a linear FM signal. The linear FM signal is coupled to a dispersive delay line which time compresses the linear FM signal. When the output of the dispersive delay line is displayed as a function of time, the position of the compressed pulse on the time axis correlates to the frequency of the incoming signal. This type receiver can provide for sampling of the frequencies within, for instance, a 1.6 MHz band between 5 MHz to 6.6 MHz. For this case, the "revisit" time, that is, the time between samples of a given frequency, is typically on the order of 3.6 milliseconds.

However, with a 1.6 MHz band and with, for instance, an FSK incoming signal (frequency shift 300 Hz) being sampled only once every 3.6 milliseconds, the sampling is at less than the valid sampling rate for this FSK signal (e.g. sampling once every 3 milliseconds is required to validly sample this FSK signal). This means that certain phase shift keyed (PSK) and frequency shift keyed (FSK) signals cannot be completely demodulated. The valid sampling rate determines the critical point below which it is impossible to completely demodulate the incoming signals or do spectral analysis. In short, below the valid sampling rate there are insufficient data samples of an incoming signal and thus, insufficient information about the incoming signal for either demodulation or spectral analysis.

Once above the valid sampling rate, complete demodulation and spectral analysis of the incoming signals can be done in one receiver without the necessity of switching the incoming signals to separate conventional receivers and spectral analyzers.

In summary, it is one of the most important findings of this invention that if the variable frequency oscillator is sweep-to-sweep phase coherent, the outputs of the dispersive delay line from successive sweeps combine into a signal which is, in fact, completely demodulatable and on which a successful Fourier transform may, in fact, be performed.

With the capability of doing spectral analysis and demodulation plus the increased valid sampling rate, it is a simple matter to sweep a wide bandwidth and identify any signal which appears at the input to the compressive receiver either by demodulation or spectral analysis. This, of course, permits much more rapid identification of a source of unknown signals than has heretofore been possible.

It is, therefore, an object of this invention to provide a compressive receiver in which the spectral signature of and modulation on an incoming signal is available in real time;

It is another object of this invention to substitute for the conventional envelope detector used in a compressive receiver a Fourier transform device and to utilize a sweep-to-sweep phase coherent variable frequency oscillator, thereby to obtain the spectral signature of signals at the input of the compressive receiver;

It is a further object of this invention to substitute for the conventional envelope detector used in a compressive receiver a demodulator and to utilize a sweep-to-sweep phase coherent variable frequency oscillator, thereby to obtain complete demodulation of the signals at the input of the compressive receiver.

These and other objects of the invention will be better understood in connection with the following detailed description taken in conjunction with the appended drawings.

DETAILED DESCRIPTION

Prior to describing the prior art compressive receiver and the subject invention, it will be appreciated that in present day compressive receivers, once a signal of interest or possible interest has been found, the incoming signal is switched to a separate receiver for demodulation. However, typically, there may be as many as 3,000-5,000 signals present or active at any one time, most of which are not of interest. The problem then becomes how to determine which of the signals are of interest and their sources by using a single compressive receiver. It should be noted that the usual technique for sorting signals involves completely parallel conventional receiver channels. As will be seen, the subject technique utilizes only one receiver for recognizing or displaying the spectral signature and/or modulation of any signal which appears at the input to the compressive receiver.

Figure 1:
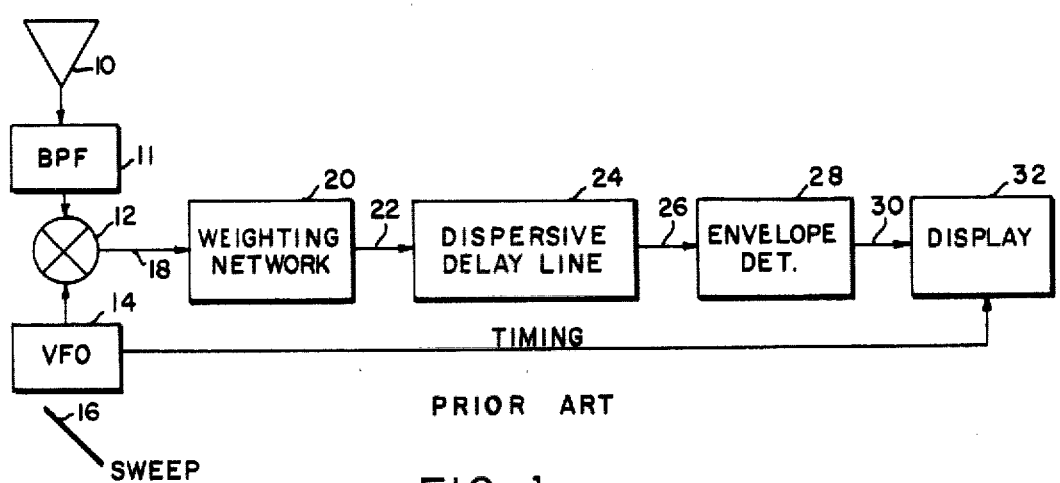
FIG. 1 is a block diagram showing a prior art and conventional compressive receiver.

Referring now to FIG. 1, the compressive receiver in its conventional form, may be characterized as having an antenna 10 coupled through a conventional wide band pass filter 11 to a conventional mixer 12 to which is also coupled a variable frequency oscillator 14 which is frequency swept in a periodic fashion as illustrated by ramp 16. The output of the mixer is applied over line 18 to a conventional weighting network 20 which has a bandwidth commensurate with the bandwidth of the delay line. This network is a Gaussian shape frequency filter to reduce the side lobe level down to 60 db below the main lobe, which increases the dynamic range of the system. The network does this by applying Gaussian weighting in the frequency domain to incoming signals.

The output of the weighting network is applied over line 22 to a conventional dispersive delay line 24 which is then connected via line 26 to a conventional envelope detector 28 and thence over line 30 to a conventional display 32. The delay line is an ultrasonic delay line and is dispersive in the sense that its delay changes with frequency.

As mentioned hereinbefore, it is a function of the compressive receiver to detect incoming signals within a predetermined frequency band by heterodyning a local oscillator signal with the incoming signals. The sweep of the local oscillator is very carefully controlled so that at any given point in time, the frequency to which the compressive receiver is tuned is accurately determined. One such local oscillator is illustrated in U.S. Pat. No. 3,382,460, issued to D. Blitz et al on May 7, 1968, incorporated herein by reference.

Figure 2:
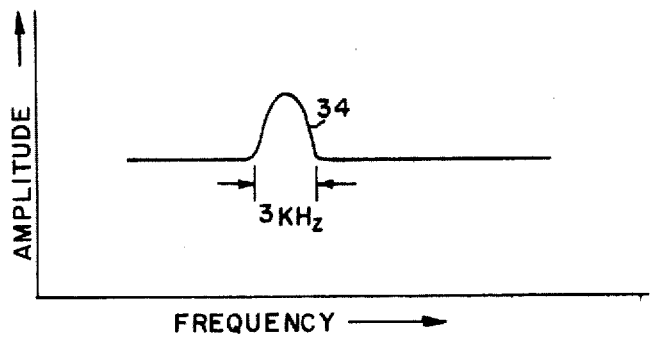
FIG. 2 is a graph of amplitude versus frequency of the output signal from the envelope detector of the prior art compressive receiver.

Referring to FIG. 2, the output signal from the conventional compressive receiver of FIG. 1 is shown for a typical high frequency (HF) case. In this case, the minimum bandwidth resolvable is 3 KHz as illustrated by waveform 34. Thus, the frequency "bins" of the conventional compressive receiver are 3 KHz wide. It will be appreciated that the envelope detector 28 destroys most spectral information and therefore, precludes not only the obtaining of the spectral signature or "fingerprint" of the incoming signal, but also prohibits complete demodulation of any one of the incoming signals.

Figure 3:
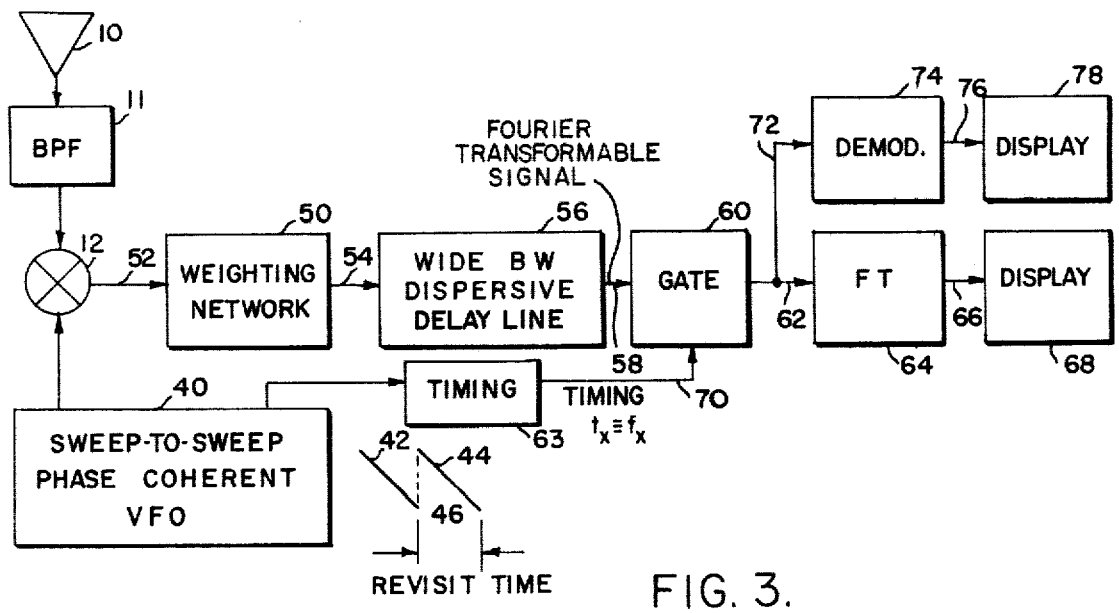
FIG. 3 is a block diagram of the subject invention illustrating the use of a sweep-to-sweep phase coherent variable frequency oscillator, a wide bandwidth dispersive delay line, and either a Fourier transform device or a demodulator coupled to the output of the dispersive delay line.

Referring now to FIG. 3, in the subject invention, the compressive receiver includes the conventional antenna 10 of FIG. 1, the conventional band pass filter 11 of FIG. 1, the conventional mixer 12 of FIG. 1, and the sweep-to-sweep phase coherent variable frequency oscillator 14 of FIG. 1. However, the sweep-to-sweep phase coherence of the aforementioned Blitz et al, was not heretofore used for spectral analysis purposes in compressive receivers. This sweep-to-sweep phase coherence is illustrated by the two VFO ramp lines 42 and 44 and the dotted line 46. With this sweep-to-sweep phase coherence it has now been calculated that despite "residual FM", the output of the dispersive delay line is, in fact, Fourier transformable, and this finding forms one of the bases for the subject invention. Moreover, with sweep-to-sweep phase coherence, calculations show that complete demodulation is, in fact, possible despite "residual FM", assuming a sampling rate above the valid samling rate; and this finding forms another of the bases for the subject invention.

For purposes of illustration only, it will be assumed that the band of interest for incoming signals is a 1.6 MHz band. It is, therefore, important that the bandpass filter here illustrated at 11 have a bandwidth corresponding to the intended frequency coverage band of the receiver. Thus, the wide bandwidth bandpass filter 11 has a bandwidth at least as wide as 1.6 MHz in the case illustrated. As illustrated, the output of mixer 12 is applied to weighting network 50 over line 52, and the output of the network is carried over line 54 to an ultra thin, wide bandwidth dispersive delay line 56 which in one embodiment has a bandwidth of 1.6 MHz. In general, the bandwidth of this line is a 2:1 improvement over previous thicker lines. As will be described, this wide bandwidth is obtained due to a reduction in thickness of the aluminum strip line by $\frac{1}{2}$, with cross sectional shape accuracy requirements doubled.

The revisit time is obtained by use of the expression $$\left(\frac{B}{\Delta} + 1\right) T.$$

where B is the band of interest (1.6 MHz), $\Delta$ is the bandwidth of the delay line, and T is the differential delay of the line. This yields a revisit time of 1.8 milliseconds (including reset time), which is a 2:1 improvement over prior compressive receivers.

Also, as mentioned before, the short "revisit" time which increases the sampling rate above the valid sampling rate, when coupled with sweep-to-sweep coherent variable frequency oscillators, results in an output signal from the delay line, which is, in fact, Fourier transformable. It is Fourier transformable because the sweep-to-sweep coherence of the oscillator provides for a coherent signal at the output of the dispersive delay line.

With this recognition, the Fourier transformable output signal from delay line 56 is coupled via line 58 through a gate or switch 60 and line 62 to a Fourier transform device 64. This Fourier transform device is conventional and may be either a Fast Fourier Transform spectrum analyzer, a Discrete Fourier Transform spectrum analyzer, or in fact, any device which performs a Fourier transform function such as any of a variety of different correlation devices. The output of the Fourier transform device is delivered over line 66 to a conventional display 68 which displays the spectra of the incoming signal which is gated via gate 60 to the Fourier transform device.

Gate 60 is actuated by a timing signal from the sweep-to-sweep phase coherent variable frequency oscillator and is delivered over line 70 such that for a signal of a given frequency $f_x$, gate 60 is opened and conducts the signal on line 58 to line 62. At the same time interval, i.e. from the beginning of each sweep. The time for the opening of gate 60 is derived from the time from the start of the sweep as mentioned in the Blitz et al patent line 34, of Col. 3 and it is related on a one to one manner to frequency $f_x$. This signal marks the start of the VFO ramp. Once having defined the start of the ramp, conventional timing circuitry 63 coupled to this signal sets the exact time of the opening of gate 60. It will be appreciated that at any given time, $t_x$ after the start of a ramp, the compressive receiver is tuned to a given frequency $f_x$. Thus, by opening gate 60 at the appropriate time, signals of a given frequency may be analyzed. In general, gate 60 is opened less than a time equivalent to 3 KHz. The Fourier transform device analyzes the frequency spectrum of a signal within a 3 KHz wide bin centered on the frequency corresponding to the gate center.

Becaue of the 2:1 improvement in performance of the dispersive delay line, the signals at the output of the delay line are samples at a rate which exceeds the valid sampling rate. This permits complete demodulation of a signal within a given frequency bin. In order to accomplish this, the output of gate 60 is coupled via line 72 to a conventional demodulator 74. The output of the demodulator, under usual circumstances is coupled via line 76 to a conventional display 78 which may, for instance, be an oscilloscope.

Demodulator 74, as mentioned before, may be any type of conventional demodulator such as an AM, FM, or SSB demodulator. Moreover, the demodulator may include band-pass processing and/or I and Q processing.

Figure 4:
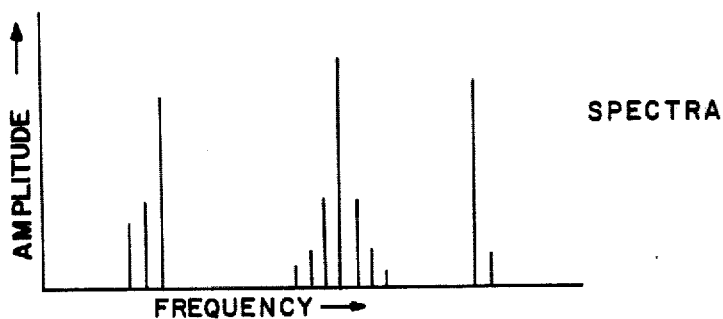
FIG. 4 is a graph illustrating typical spectra of incoming signals resolved by the subject compressive receiver.

Referring now to FIG. 4 for a signal in a given frequency bin the pattern displayed by display 68 may be as shown. What is shown is the spectrum of the signal within the frequency bin and this spectra is commonly referred to as the spectral signature or its "fingerprint". It will be appreciated that each source has its own characteristic spectra or fingerprint and may be identified.

Figure 5:
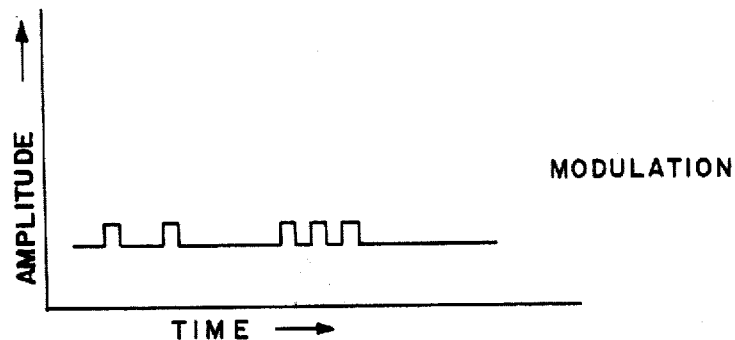
FIG. 5 is a diagram showing demodulation of the signals in one frequency bin of the compressive receiver of FIG. 3.

Referring to FIG. 5, the modulation of the signal within a frequency bin may be as depicted in this figure and would be as displayed by display 78. In the case illustrated, pulse code modulation (phase shift keyed) is detected and in general, the modulation type also gives an indication of the source of the signals.

What has been described thus far is a compressive receiver capable of real time spectral analysis and demodulation in which the particular frequency bin analyzed is chosen by the timing signal to gate 60. It is possible by parallel processing techniques to determine which signals are of interest and then to set gate 60 to respond to any one of these selected signals. This precludes the necessity of providing a large number of parallel conventional receiving channels since the entire task of signal source identification takes place within one compressive receiver.

Figure 6:
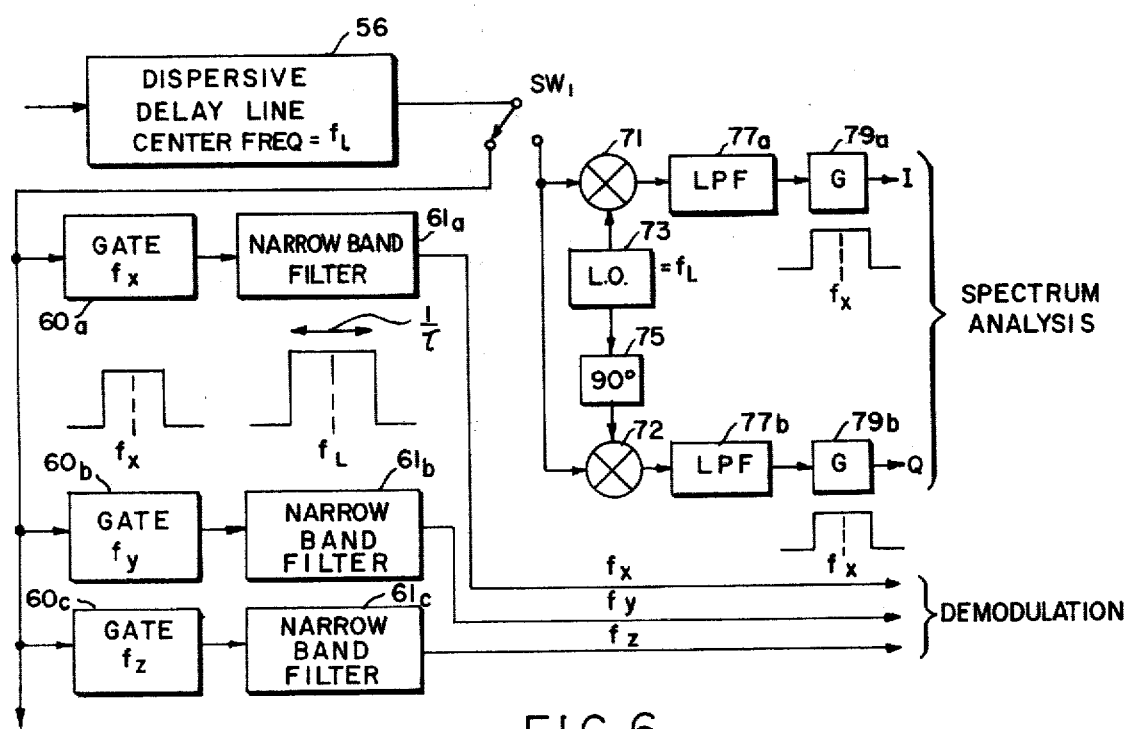
FIG. 6 is a block diagram of the subject compressive receiver with two different systems for eliminating unwanted modulation products from the output of the delay line used with the compressive receiver prior to demodulation or spectral analysis.

Referring now to FIG. 6, a block diagram is shown in which the output of dispersive delay line 56 of FIG. 3 may be either switched by switch $SW_1$ to a narrow band filter circuit or to an in-phase and quadrature signal generating circuit which also incorporates some filtering. The purpose of these circuits is to reject unwanted modulation products. In general, band-pass filter circuit technique is more useful for demodulating signals of interest whereas the I and Q processing circuit is more useful in spectral analysis, since digital spectrum analyzers are designed for in-phase and quadrature input signals.

In the embodiment shown, the dispersive delay line has a center frequency equal to $f_L$. When switch $SW_1$ is in the position shown, the output of the dispersive delay line is coupled to a bank of gates 60, a, b, c, etc., only three of which are shown here. It will be appreciated that the turning on of gate 60 at a particular time corresponds to the compressive receiver being tuned to a given frequency $f_x$. Gate 60a is connected to a narrow band filter 61a which has as its center frequency, $f_L$, with the bandwidth of the filter being $1/\tau$ where $\tau$ is the revisit time. Note each narrow band filter has $f_L$ as its center frequency. Each gate/narrow band filter combination represents a different frequency to which the compressive receiver is tuned such that as illustrated, the outputs of the narrow band filters 60a, 60b and 60c represent the receiver tuned to frequencies $f_x$, $f_y$, and $f_z$.

Alternatively, switch $SW_1$ may switch the output of the dispersive delay line to one input port of conventional two input port mixers 71 and 72. The other input port to mixer 71 is the output of a local oscillator 73 tuned to $f_L$. The output of local oscillator 73 is phase-shifted by 90 degrees by a conventional phase-shifter 75. The output of this phase shifter is applied to the other input port of multiplier 72. The output ports of multipliers 71 and 72 are applied to conventional low pass filters 77a and 77b respectively. It is the purpose of the low pass filters to eliminate all sum terms in the signals from the multipliers, thereby to eliminate unwanted modulation products. The outputs of low pass filter 77a and 77b are applied to gates 79a and 79b respectively which are activated at the appropriate time when, for instance, the receiver is tuned to a frequency $f_x$. Gates 79a and 79b are the equivalents of gate 60 of FIG. 3 and may be activated simultaneously.

It will be appreciated that while the band-pass filter bank configuration is useful in demodulating incoming signals, it may be used with spectrum analyzers as well; while the I and Q processing system, while being particularly useful for spectrum analyzers, is useful in providing input signals for conventional I and Q demodulators. In either case, the circuits of FIG. 6 eliminate unwanted modulation products and are useful in obtaining valid sampling at lower than the usual Nyquist rate.

Although preferred embodiments of the invention have been described in considerable detail for illustrative purposes, many modifications will occur to those skilled in the art. It is therefore desired that the protection afforded by Letters Patent be limited only by the true scope of the appended claims.

We claim:

1. An augmented compressive receiver system for processing the output of a compressive receiver that splits an incoming frequency band into a band of frequency bins, in which narrow band signals of interest might appear, wherein said compressive receiver is of the type that includes:
    a delay line for time compressing the signals in the frequency band; and
    gating means for selectively sampling at adequate sample rates the output of said delay line at regular intervals corresponding to a frequency bin on which narrow band signals of interest have appeared, and wherein said augmented compressive receiver comprises:
    (a) means for recovering the signal of interest outputted by said gating means so that a spectrum analysis and/or a demodulation may be performed on the signals of interest;
    (b) means for converting the output of said delay line into in-phase (I) and quadrature (Q) base band signals; and
    (c) sampling means for periodically sampling the I and Q outputs of said converting means at times corresponding to frequency bins on which narrow band signals of interest have appeared;
    whereby said augmented compressive receiver processes each frequency bin to determine the spectral content of said signals.

2. The system claimed in claim 1 wherein said recovery means comprises a plurality of narrow band filters.

3. The system claimed in claim 2 wherein the band width of each of said narrow band filters is equal to or greater than the band width of all signals of interest.

4. The system claimed in claim 2 wherein each of said narrow band filters has a center frequency equal to the center frequency of said dispersive delay line.

5. The system claimed in claim 1 wherein said converting means comprises:
    (a) an oscillator the frequency of said oscillator is equal to the center frequency of said delay line;
    (b) a 90 degree phase shifter whose input is coupled to one of the outputs of said oscillator;
    (c) a first mixer coupled to the output of said phase shifter and said delay line to produce upper and lower side bands;
    (d) a low pass first filter coupled to the output of said first mixer, said first filter removes the upper side band to produce the Q signal;
    (e) a second mixer coupled to one of the outputs of said oscillator and said delay line to produce upper and lower side bands; and
    (f) a low pass second filter coupled to the output of said second mixer, said second filter removes the upper side band to produce the I signals.

6. The system claimed in claim 1 wherein said sampling means is a plurality of gates.

7. The system claimed in claim 1 further including a plurality of demodulators 74 whose inputs are coupled to the output of said recovery means said demodulator recovers the modulation of said signal.

8. The system claimed in claim 7 wherein said demodulators are AM demodulators.

9. The system claimed in claim 7 wherein said demodulators are FM demodulators.

10. The system claimed in claim 7 wherein said demodulators are phase shift keying demodulators.

11. The system claimed in claim 1, further including a plurality of spectrum analyzers whose inputs are coupled to the output of said sampling means so that the spectrum of said signal may be determined.

12. The system claimed in claim 1 further including a plurality of spectrum analyzers whose inputs are coupled to the output of said recovery means so that the spectrum of said signal may be determined.

13. The system claimed in claims 11 and 12 wherein said spectrum analyzers are Fast Fourier Transform Spectrum analyzers.

* * * * *